United States Patent
Wong

(10) Patent No.: US 6,279,145 B1
(45) Date of Patent: Aug. 21, 2001

(54) APPARATUS AND METHOD FOR ISOLATING NOISY SIGNALS IN AN INTEGRATED CIRCUIT

(75) Inventor: Myron Wai Wong, Fremont, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/272,259

(22) Filed: Mar. 17, 1999

Related U.S. Application Data

(60) Provisional application No. 60/087,010, filed on May 28, 1998.

(51) Int. Cl.$^7$ .............................. G06F 17/50; H03K 19/00
(52) U.S. Cl. .................................. 716/17; 326/21
(58) Field of Search ................... 326/21, 22, 26, 326/37, 38, 39, 85, 87, 91, 41, 47, 101; 716/16, 17, 1

(56) References Cited

U.S. PATENT DOCUMENTS

| | | | |
|---|---|---|---|
| 5,715,408 | * 2/1998 | Chidhambarakirshnan | ......... 395/306 |
| 6,043,702 | * 3/2000 | Singh | ................................. 327/534 |
| 6,175,952 | * 1/2001 | Patel et al. | .......................... 716/18 |

* cited by examiner

*Primary Examiner*—Matthew Smith
*Assistant Examiner*—Leigh Marie Garbowski
(74) *Attorney, Agent, or Firm*—Pennie & Edmonds LLP

(57) ABSTRACT

A circuit to reduce erroneous signal glitches in the presence of overshoot and undershoot signals includes an output node and an input node to alternately receive overshoot and undershoot signals. A noise-vulnerable transistor is connected to the input node. An output isolation transistor is connected between the noise-vulnerable transistor and the output node. A pull-up transistor controls the charge state at a control node between the noise-vulnerable transistor and the isolation transistor, such that if the overshoot and undershoot signals cause the noise-vulnerable transistor to turn-on, the pull-up transistor establishes a charge state at the control node that keeps the output isolation transistor off and therefore isolates the output node from erroneous signal glitches.

20 Claims, 4 Drawing Sheets

APPARATUS AND METHOD FOR ISOLATING NOISY SIGNALS IN AN INTEGRATED CIRCUIT

This application claims priority to the provisional patent application entitled: "Overshoot and Undershoot Isolation Circuit for Internal Glitch Prevention", Ser. No. 60/087,010, filed May 28, 1998.

BRIEF DESCRIPTION OF THE INVENTION

This invention relates generally to noise isolation in integrated circuits. More particularly, this invention relates to a circuit that prevents overshoot and undershoot signals on an input node from generating internal glitch signals on an output node of a circuit.

BACKGROUND OF THE INVENTION

Digital systems commonly operate in noisy conditions. Noisy conditions are usually defined as environments where there are signals unrelated to the signal of interest. In some cases, the noise content can be so large that false switching occurs. That is, noise can cause a digital low signal to appear as a digital high signal or vice versa.

On occasion, noise conditions cause erroneous signal glitches between circuit nodes that should otherwise be isolated. This problem is especially common in those cases where the two nodes are at times connected and at times disconnected by an isolation circuit, such as a multiplexer or pass transistor. For example, assume there is an input node that is supposed to be isolated from an output node with an n-channel pass transistor whose gate is grounded. The pass transistor will turn-on if the undershooting signal on the input node is more negative in magnitude than the Vtn of the pass transistor. Conversely, for a p-channel pass transistor, if the overshoot signal is greater than the Vtp of the pass transistor, it too will turn-on. In both cases, a signal glitch occurs on the output node that was supposed to be isolated.

In view of the foregoing, it would be highly desirable to provide an isolation circuit that prevents signal glitches in the presence of undershoot and overshoot signals. Ideally, such a circuit should be simple to implement and should otherwise be compatible with existing circuit designs.

SUMMARY OF THE INVENTION

The apparatus of the invention includes a circuit to reduce erroneous signal glitches in the presence of overshoot and undershoot signals. The circuit includes an output node and an input node that alternately receives overshoot and undershoot signals. A noise-vulnerable transistor is connected to the input node. An output isolation transistor is connected between the noise-vulnerable transistor and the output node. A pull-up transistor controls the charge state at a control node between the noise-vulnerable transistor and the isolation transistor, such that if the overshoot and undershoot signals cause the noise-vulnerable transistor to turn-on, the pull-up transistor establishes a charge state at the control node that keeps the output isolation transistor off and therefore isolates the output node from erroneous signal glitches.

The method of the invention includes the steps of receiving overshoot and undershoot signals. A noise-vulnerable transistor is turned-on in response to the overshoot and undershoot signals. The charge state at a node of an output isolation transistor is controlled in response to the turning-on step. As a result, the charge state keeps the output isolation transistor off and therefore isolates an output node from the overshoot and undershoot signals.

The technique of the invention limits the impact of noisy signals in integrated circuits. In particular, the invention prevents signal glitches in the presence of undershoot and overshoot signals. The circuit is simple to implement and is otherwise compatible with existing circuit designs.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
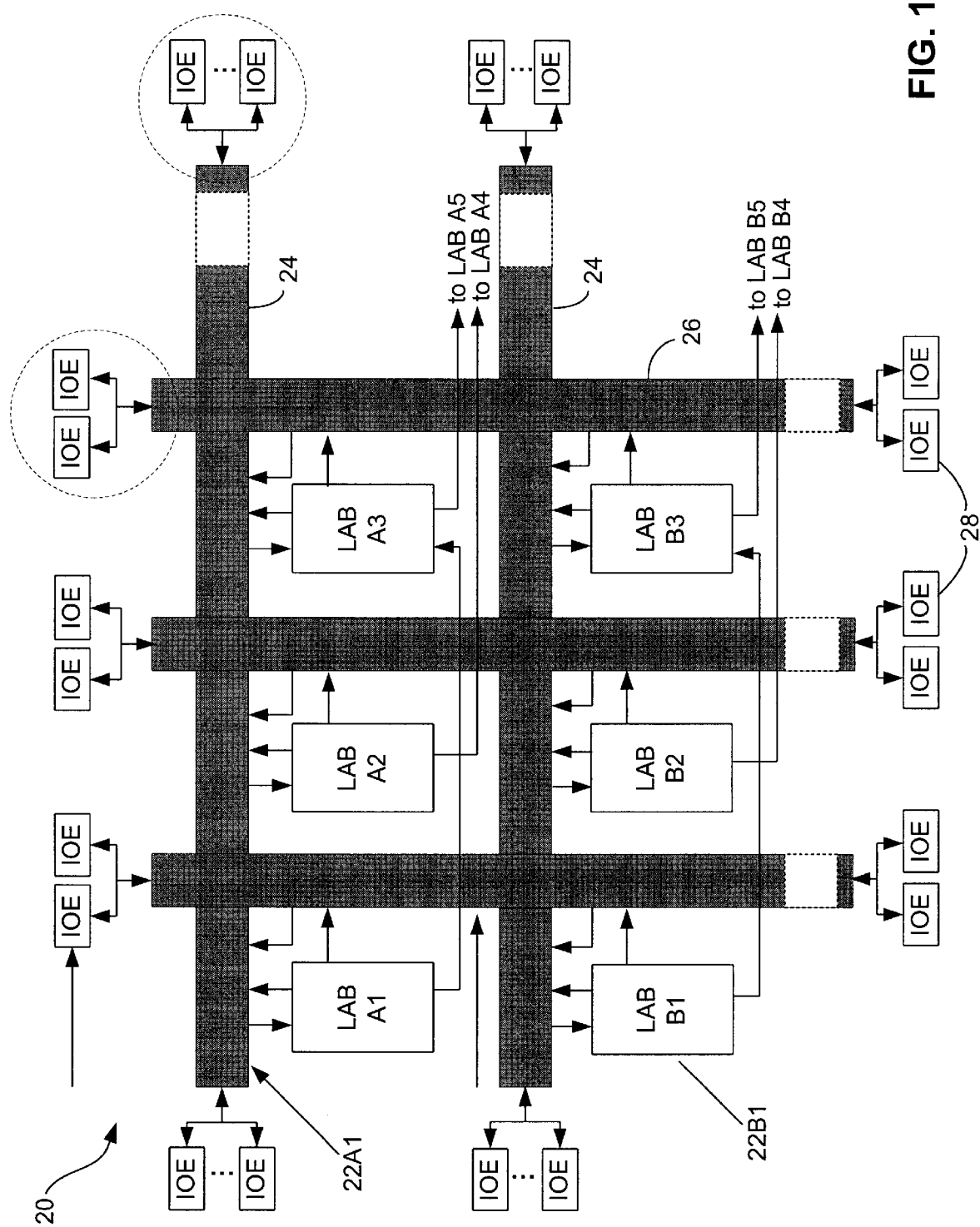
FIG. 1 illustrates a programmable logic device incorporating an overshoot and undershoot isolation circuit of the invention.

FIG. 1 illustrates an integrated circuit in the form of a programmable logic device 20. The circuit 20 incorporates overshoot and undershoot isolation circuits in accordance with the invention. The programmable logic device 20 includes a set of logic array blocks 22. Row interconnect circuitry 24 and column interconnect circuitry 26 link the various logic array blocks 22. The logic array blocks 22 include logic circuits that need to be isolated from one another. Thus, the logic array blocks 22 may utilize the overshoot and undershoot isolation circuit of the invention. Input/output elements 28 positioned at the ends of the row interconnect circuitry 24 and column interconnect circuitry 26 are used for input/output connections with external devices. The overshoot and undershoot isolation circuit of the invention may also be used with the input/output elements 28.

Figure 2:
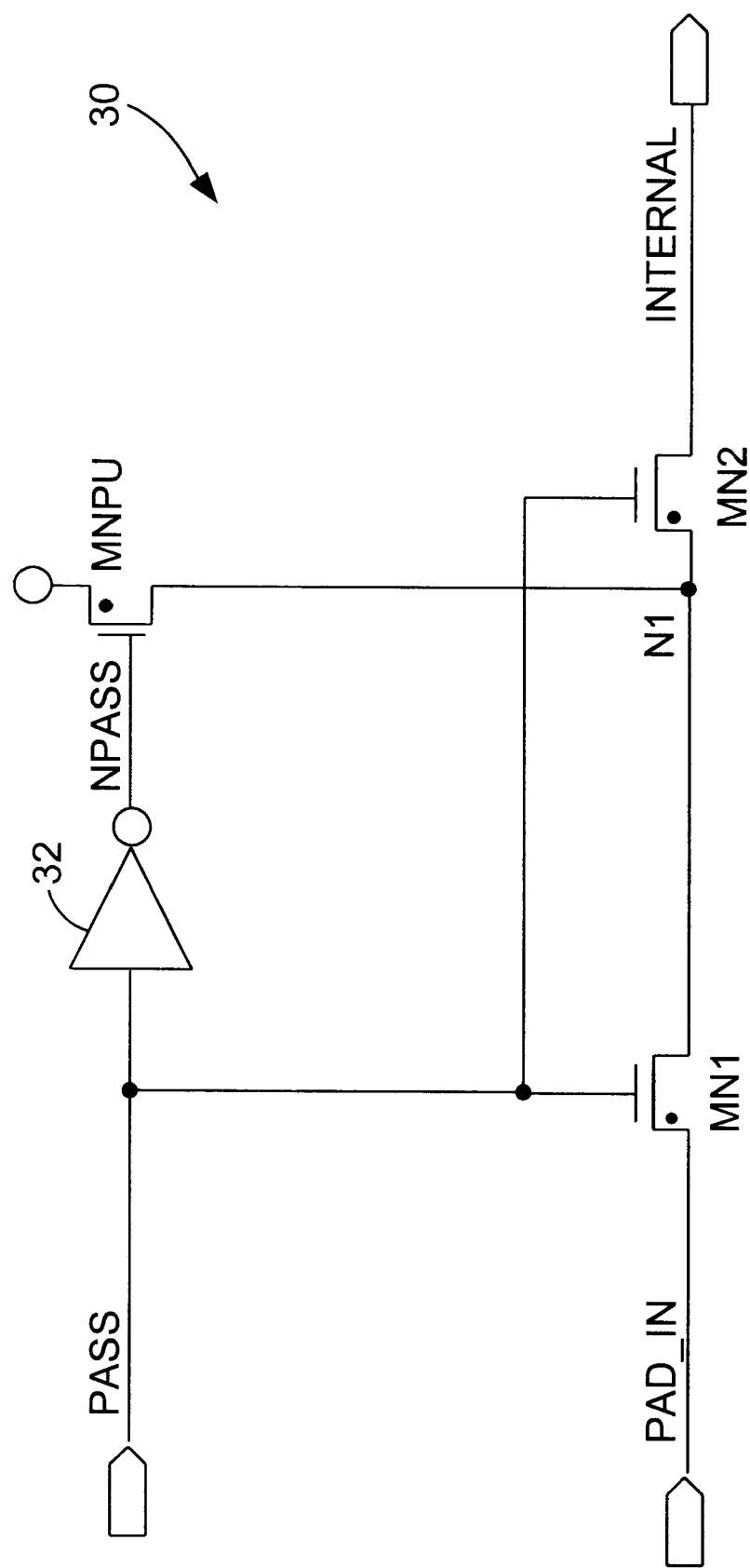
FIG. 2 illustrates one embodiment of an overshoot and undershoot isolation circuit in accordance with an embodiment of the invention.

FIG. 2 illustrates one embodiment of the overshoot and undershoot isolation circuit of the invention. The circuit 30 includes an input node (PAD_IN) that alternately receives overshoot and undershoot signals. The circuit 30 also includes an output node (INTERNAL), which is connected to a noise-sensitive circuit (not shown).

The isolation circuit 30 includes a noise-vulnerable transistor (MN1) connected to the input node (PAD_IN). In the prior art, a single noise-vulnerable transistor (MN1) is used to establish isolation between the input node (PAD_IN) and the output node (INTERNAL). In accordance with the invention, an output isolation transistor (MN2) is positioned between the noise-vulnerable transistor (MN1) and the output node (INTERNAL). Further, the invention provides a pull-up transistor (MNPU), whose output is connected to a control node (N1) between the noise-vulnerable transistor (MN1) and the output isolation transistor (MN2). An inverter 32 is positioned at the gate of the pull-up transistor (MNPU).

A pass signal on a pass node (PASS) is driven digitally low when isolation between the input pad (PAD_IN) and the output pad (INTERNAL) is desired. This digital low signal is applied to the gate of the noise-vulnerable transistor (MN1) and the output isolation transistor (MN2), causing each transistor to remain off. The digital low pass signal is also inverted by the inverter 32. As a result, the pull-up transistor (MNPU) turns-on. This produces a drive voltage on the control node N1. The drive voltage insures that the output isolation transistor (MN2) remains off, thereby providing internal glitch protection from overshoot and undershoot signals.

When undershoot occurs, the signal on the input node (PAD$_{13}$ IN) is more negative in magnitude than the Vtn of the noise-vulnerable transistor (MN1), thus, the noise-vulnerable transistor (MN1) turns-on. The current drawn through the noise-vulnerable transistor (MN1) from the control node N1 to the input node (PAD_IN) is supplied from the pull-up device (MNPU). The charging source to the input node (PAD_IN) insures that the output isolation transistor (MN2) does not observe an undershoot signal. The pull-up transistor (MNPU) is sized strong enough to keep node N1 high enough to prevent the output isolation transistor (MN2) from turning on. Thus, the effect of the signal undershoot at the input node (PAD_IN) is isolated from the output node (INTERNAL).

Figure 3:
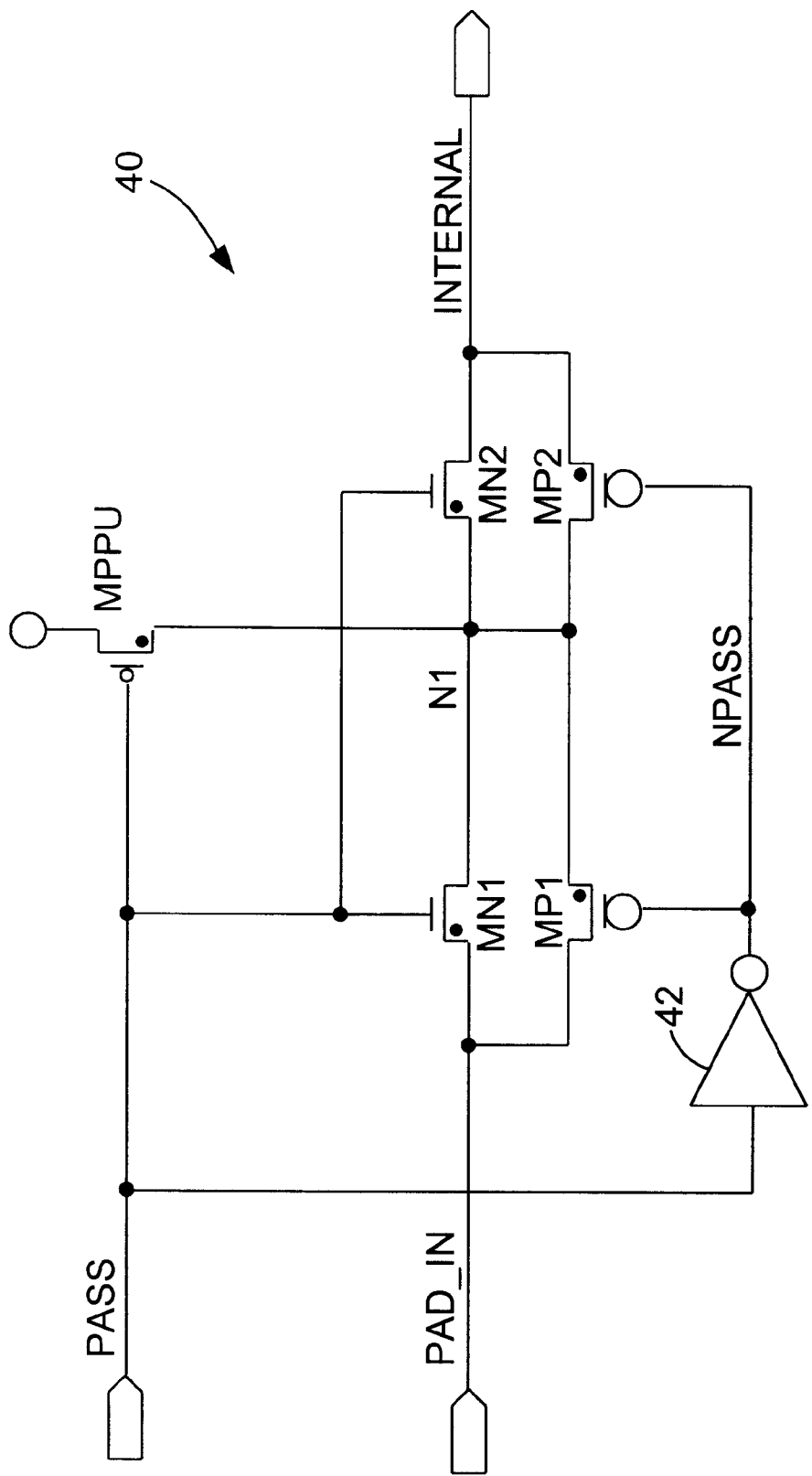
FIG. 3 illustrates a second embodiment of an overshoot and undershoot isolation circuit in accordance with a second embodiment of the invention.

FIG. 3 illustrates an alternate embodiment of an overshoot and undershoot isolation circuit of the invention. The circuit 40 of FIG. 3 generally corresponds to the circuit of FIG. 2, but it includes a P-channel path through devices MP1 and MP2. The P-channel path avoids Vt drops associated with the N-channel path through transistors MN1 and MN2 and therefore provides a full signal level at the output node (INTERNAL).

The circuit 40 of FIG. 3 includes a PMOS pull-up transistor (MPPU), an inverter 42, a set of noise-vulnerable transistors (MN1, MP1), and a set of output isolation transistors (MN2, MP2). As in the previous embodiment, a digital low pass signal causes the pull-up transistor (MPPU) to establish a drive voltage on the node N1 between the noise-vulnerable transistors and the output isolation transistors. The digital low pass signal is inverted by the inverter 42 to turn-off the transistors MP1 and MP2. Noise isolation in the case of an undershoot signal is established in the manner described in connection with FIG. 2.

In the case of an overshoot signal on the input node (PAD_IN), noise-vulnerable transistor MP1 turns-on. In this case, current may pass through the input node (PAD_IN), the noise-vulnerable transistor (MP1), and the pull-up transistor (MPPU) and be discharged to VCC. This limit the overshoot magnitude observed by the output isolation transistor MP2. The pull-up transistor (MPPU) is sized strong enough to keep node N1 at VCC to prevent the output isolation transistor (MP2) from turning on. Thus, circuit 40 establishes isolation between the input node (PAD_IN) and the output node (INTERNAL) for both signal overshoot and undershoot conditions.

Figure 4:
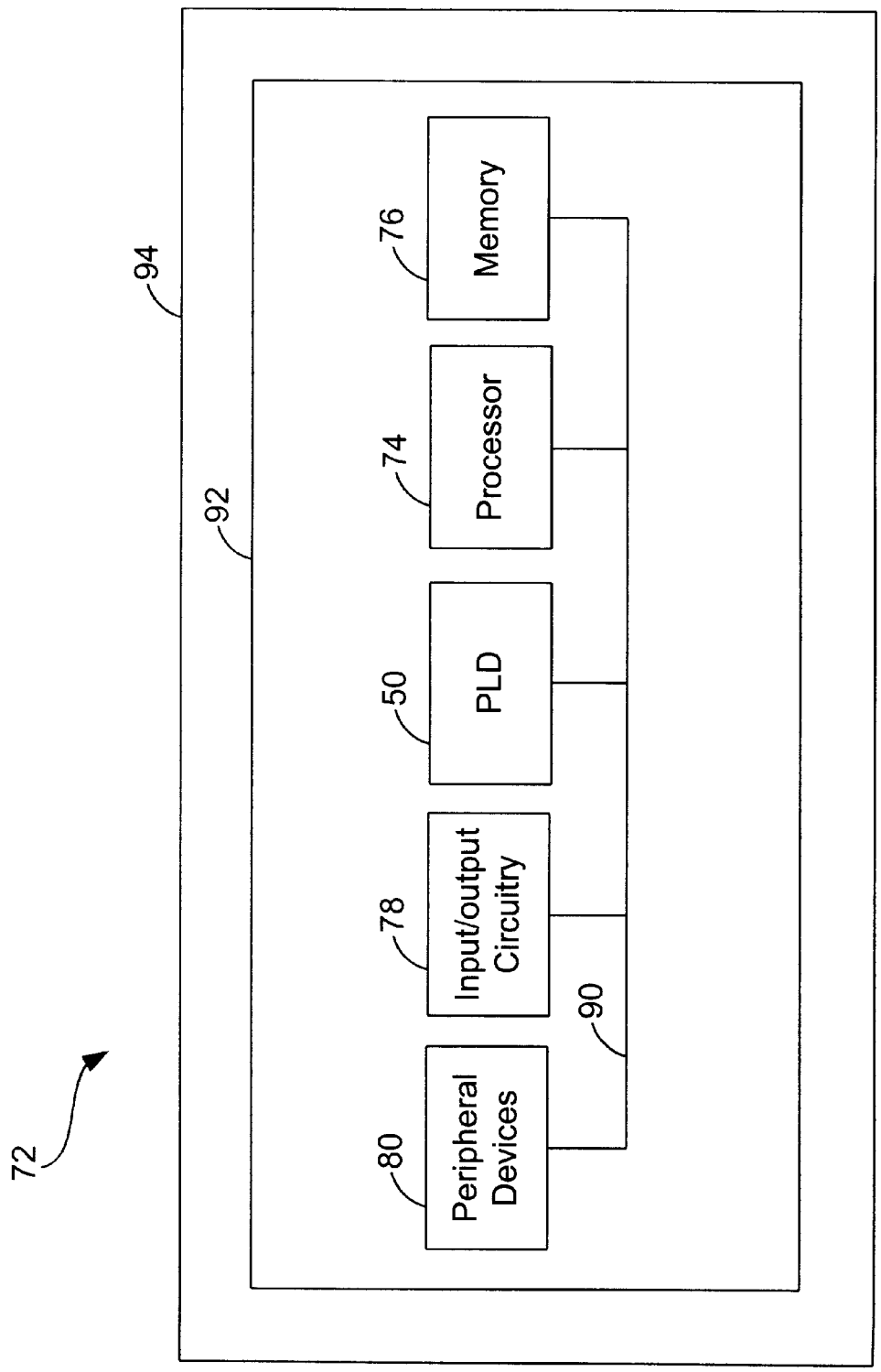
FIG. 4 illustrates the programmable logic device of FIG. 1 forming a portion of a larger digital system.

FIG. 4 illustrates a programmable logic device (PLD) 50 with overshoot and undershoot isolation circuits of the invention forming a part of a data processing system 72. The data processing system 72 may include one or more of the following components: a processor 74, a memory 76, input/output circuitry 78, and peripheral devices 80. These components are coupled together by a system bus 90 and are populated on a circuit board 92, which is contained in an end-user system 94.

The system 72 can be used in a wide variety of applications, such as computer networking, data networking, instrumentation, video processing, digital signal processing, or any other application where the advantage of using re-programmable logic is desirable. The PLD 70 can be used to perform a variety of logic functions. For example, the PLD 70 can be configured as a processor or controller that works in cooperation with processor 74. The PLD 70 may also be used as an arbiter for arbitrating access to a shared resource in the system 72. In yet another example, the PLD 70 can be configured as an interface between the processor 74 and one of the other components in the system 72.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A circuit to reduce erroneous signal glitches in the presence of overshoot and undershoot signals, comprising:
   an input node to alternately receive overshoot and undershoot signals;
   an output node;
   a noise-vulnerable transistor connected to said input node;
   an output isolation transistor connected between said noise-vulnerable transistor and said output node; and
   a pull-up transistor to control a charge state at a control node between said noise-vulnerable transistor and said output isolation transistor, such that if said overshoot and undershoot signals cause said noise-vulnerable transistor to turn-on, said pull-up transistor establishes a charge state at said control node that keeps said output isolation transistor off and therefore isolates said output node from erroneous signal glitches.

2. The circuit of claim 1 wherein said noise-vulnerable transistor includes a first NMOS transistor on an NMOS signal path and a first PMOS transistor on a PMOS signal path.

3. The circuit of claim 2 wherein said output isolation transistor includes a second NMOS transistor on said NMOS signal path and a second PMOS transistor on said PMOS signal path.

4. A programmable logic device, comprising:
   a noise-sensitive node; and
   a noise isolation circuit connected to said noise-sensitive node, said noise isolation circuit including:
     an input node to alternately receive overshoot and undershoot signals;
     an output node connected to said noise-sensitive node;
     a noise-vulnerable transistor connected to said input node;
     an output isolation transistor connected between said noise-vulnerable transistor and said output node; and
     a pull-up transistor to control a charge state at a control node between said noise-vulnerable transistor and said output isolation transistor, such that if said overshoot and undershoot signals cause said noise-vulnerable transistor to turn-on, said pull-up transistor establishes a charge state at said control node that keeps said output isolation transistor off and therefore isolates said output node from erroneous signal glitches.

5. The programmable logic device of claim 4 in combination with a system bus.

6. The programmable logic device of claim 5 further comprising a peripheral device connected to said system bus.

7. The programmable logic device of claim 5 further comprising input/output circuitry connected to said system bus.

8. The programmable logic device of claim 5 further comprising a processor connected to said system bus.

9. The programmable logic device of claim 5 further comprising a memory connected to said system bus.

10. A circuit to reduce erroneous signal glitches in the presence of undershoot signals, comprising:
an input node to receive an undershoot signal;
an output node;
a noise-vulnerable transistor connected to said input node;
an output isolation transistor connected between said noise-vulnerable transistor and said output node; and
a pull-up transistor to drive a voltage on a control node between said noise-vulnerable transistor and said output isolation transistor, such that if said undershoot signal causes said noise-vulnerable transistor to turn-on, said drive voltage from said pull-up transistor keeps said output isolation transistor off and therefore isolates said output node from erroneous signal glitches.

11. The circuit of claim 10 further comprising a pass signal node coupled to the gates of said noise-vulnerable transistor, said output isolation transistor, and said pull-up transistor.

12. The circuit of claim 11 further comprising an inverter positioned between said pass signal node and said gate of said pull-up transistor.

13. The circuit of claim 10 wherein said noise-vulnerable transistor and said output isolation transistor are NMOS transistors.

14. A circuit to reduce erroneous signal glitches in the presence of overshoot signals, comprising:
an input node to receive an overshoot signal;
an output node;
a noise-vulnerable transistor connected to said input node;
an output isolation transistor connected between said noise-vulnerable transistor and said output node; and
a pull-up transistor to establish a current path between said input node and a voltage source when said noise-vulnerable transistor turns-on in response to an overshoot signal, said current path through said pull-up transistor maintaining said output isolation transistor in an off state and therefore isolating said output node from erroneous signal glitches.

15. The circuit of claim 14 further comprising a pass signal node coupled to the gates of said noise-vulnerable transistor, said output isolation transistor, and said pull-up transistor.

16. The circuit of claim 15 further comprising an inverter positioned between said pass signal node and said gate of said pull-up transistor.

17. The circuit of claim 14 wherein said noise-vulnerable transistor and said output isolation transistor are each PMOS transistors.

18. A method of reducing erroneous signal glitches in the presence of overshoot and undershoot signals, said method comprising the steps of:
receiving overshoot and undershoot signals;
turning-on a noise-vulnerable transistor in response to said overshoot and undershoot signals; and
controlling a charge state at a node of an output isolation transistor, in response to said turning-on step, such that said charge state keeps said output isolation transistor off and therefore isolates an output node from said overshoot and undershoot signals.

19. The method of claim 18 wherein said receiving step includes the step of processing said undershoot signals with an NMOS transistor path.

20. The method of claim 18 wherein said receiving step includes the step of processing said overshoot signals with a PMOS transistor path.

* * * * *